(12) United States Patent
Sakaguchi

(10) Patent No.: US 8,305,122 B2
(45) Date of Patent: Nov. 6, 2012

(54) LASER DIODE DRIVER

(75) Inventor: Makoto Sakaguchi, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1179 days.

(21) Appl. No.: 11/637,178

(22) Filed: Dec. 12, 2006

(65) Prior Publication Data

US 2007/0164813 A1    Jul. 19, 2007

(30) Foreign Application Priority Data

Jan. 13, 2006    (JP) .................................. 2006-006551

(51) Int. Cl.
*H03K 17/785*    (2006.01)
*H03K 17/687*    (2006.01)
*H01S 5/06*    (2006.01)
*H05B 37/02*    (2006.01)

(52) U.S. Cl. ......... 327/170; 327/108; 327/374; 327/403

(58) Field of Classification Search ........................ None
See application file for complete search history.

(56) References Cited

U.S. PATENT DOCUMENTS

| | | | |
|---|---|---|---|
| 7,046,706 B2 * | 5/2006 | Tatehara et al. | ............ 372/38.02 |
| 7,064,696 B2 * | 6/2006 | Ohkubo et al. | ................ 341/136 |
| 7,075,338 B2 * | 7/2006 | Mizuno et al. | .................. 327/66 |
| 2005/0002429 A1 * | 1/2005 | Nakatani | .................... 372/38.02 |

FOREIGN PATENT DOCUMENTS

JP    2003-188465    7/2003

* cited by examiner

*Primary Examiner* — Lincoln Donovan
*Assistant Examiner* — Terry L Englund
(74) *Attorney, Agent, or Firm* — McGinn IP Law Group, PLLC

(57) ABSTRACT

There is provided a current switching circuit that adds additional current in accordance with an intensity of output current to input current of a current mirror at a rising edge of the output current of the current mirror. The current switching circuit includes a MOS transistor outputting the additional current upon receiving ON potential at a gate terminal, and a slope of a leading edge waveform of a pulse signal providing the ON potential is controlled in accordance with the intensity of the output current.

13 Claims, 6 Drawing Sheets

RELATED ART

LASER DIODE DRIVER

BACKGROUND OF THE INVENTION

1. Field of the Invention

The present invention relates to a current switching circuit and particularly to a current switching circuit capable of high-speed switching operation and suitable for connection with a current driving element such as a laser diode.

2. Description of Related Art

A laser diode is widely used as a light source in optical information processing units. For example, a laser diode is used as a light source of an optical head in an optical disc device. In the laser diode, output light is turned ON/OFF by a current switching circuit. For the current switching circuit, the high-speed switching operation is demanded to achieve higher information processing, and the control of output current is demanded to provide an appropriate output from the laser diode according to usage.

An example of such a current switching circuit is disclosed in Japanese Unexamined Patent Application Publication No. 2003-188465 (cf. FIG. 6). The circuit includes a current mirror 10, a current source (referred to hereinafter as a variable current source) 20, a pulse generator 30, a switch 40, and a superimposer (referred to hereinafter as a current energized circuit) 50 for reducing a pulse rising time. The current mirror 10 is composed of P-channel MOS transistors 11 and 12, and the MOS transistor 12 supplies to a laser diode LD the output current I2 which is proportional to the current I1 input to the MOS transistor 11. The variable current source 20 is composed of a variable voltage source 21 and an N-channel MOS transistor 22. The MOS transistor 22 is controlled by the variable voltage source 21 to regulate the current value of the current I1 to be supplied to the MOS transistor 11. The pulse generator 30 controls the switch 40 by a control signal S1 to supply the current I1 from the variable current source 20 to the MOS transistor 11. The current energized circuit 50 is composed of a one-shot circuit 51, an N-channel MOS transistor 52, and an N-channel MOS transistor 53. The MOS transistor 53 is controlled by the variable voltage source 21 to regulate the current value of the additional current I3 to be supplied to the MOS transistor 11. The one-shot circuit 51 controls the MOS transistor 52 by a control signal S2 to supply the additional current I3 from the MOS transistor 53 to the MOS transistor 11 at the rising edge of the output current I2.

The circuit of FIG. 6 has the variable voltage source 21 so as to control the intensity of the output current I2 in order to provide an appropriate output from the laser diode according to usage. Because the variable voltage source 21 is connected in common to the gates of the MOS transistor 22 and the MOS transistor 53, by the voltage settings of the variable voltage source 21 according to the intensity of the output current I2, the additional current I3 increases as the current I1 increases, and the additional current I3 decreases as the current I1 decreases.

In the circuit of FIG. 6, when turning on the MOS transistor 52, the additional current I3 turns ON and thereby the gate voltage of the MOS transistor 53 can be subject to fluctuations due to the parasitic capacitance between the drain and the gate of the MOS transistor 53. Consequently, upon changing the intensity of the output current I2, even if the set voltage of the variable voltage source 21 in accordance with the intensity of the output current I2 is applied to the gate of the MOS transistor 53, the MOS transistor 53 is not controlled by the set voltage of the variable voltage source 21 at the rising edge of the additional current I3, which causes overshoot or rounding to occur at the rising edge of the output current I2, thereby failing to supply the stable output current I2 to the laser diode LD.

SUMMARY OF THE INVENTION

According to one aspect of the present invention, there is provided a current switching circuit that adds additional current in accordance with an intensity of output current to input current of a current mirror at a rising edge of the output current of the current mirror, including a MOS transistor outputting the additional current upon receiving ON potential at a gate terminal, in which a slope of a leading edge waveform of a pulse signal providing the ON potential is controlled in accordance with the intensity of the output current.

In this configuration, a slope of a leading edge waveform of a pulse signal providing ON potential to be supplied to a gate terminal of the MOS transistor that outputs additional current is controlled in accordance with the intensity of output current. This enables a current energized circuit to output additional current in accordance with the intensity of the output current upon changing the intensity of the output current, thereby reducing the possibility that overshoot or rounding occurs at the rising edge of the output current.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
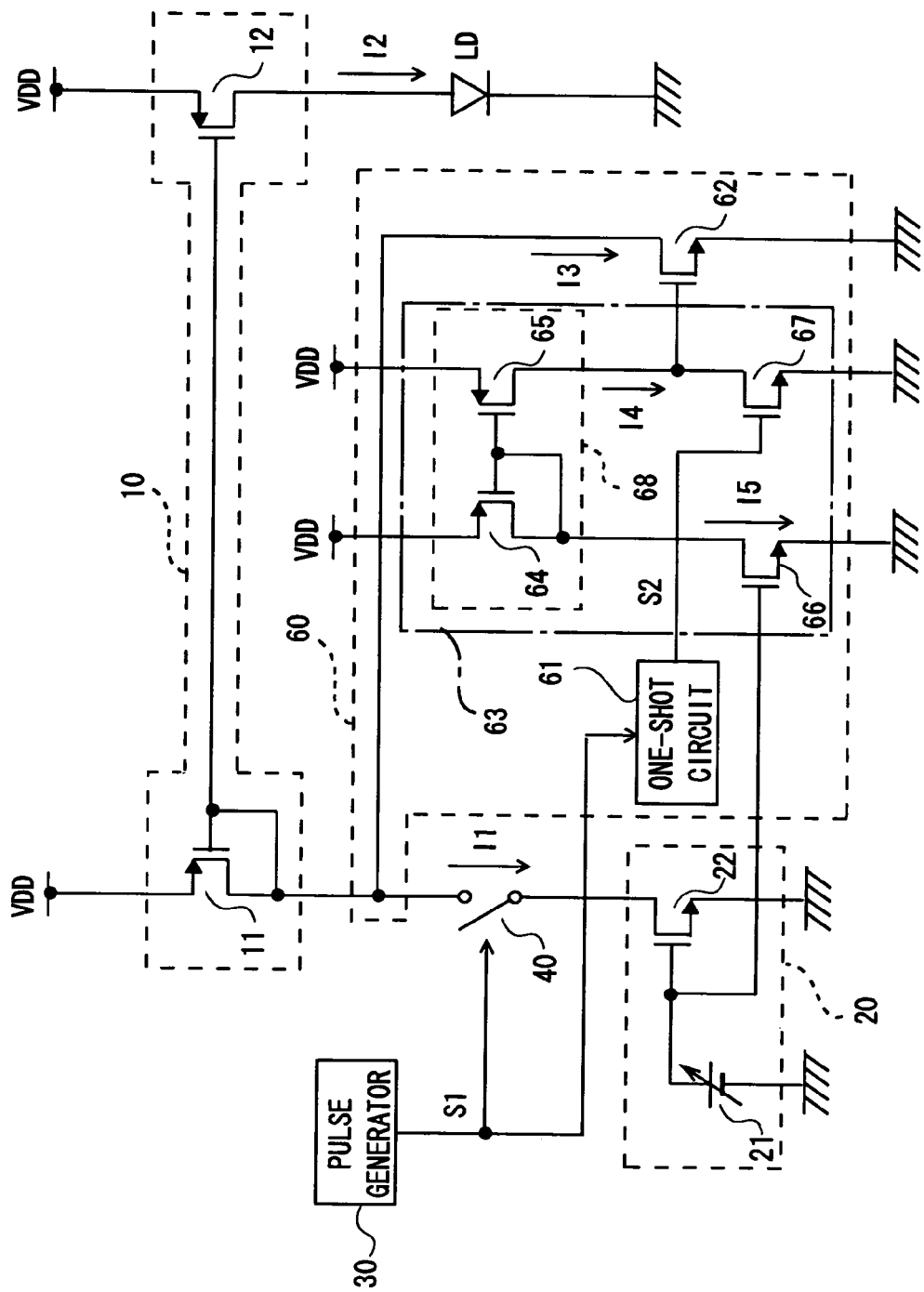
FIG. 1 is a circuit diagram showing a first embodiment of the present invention.
Figure 6:
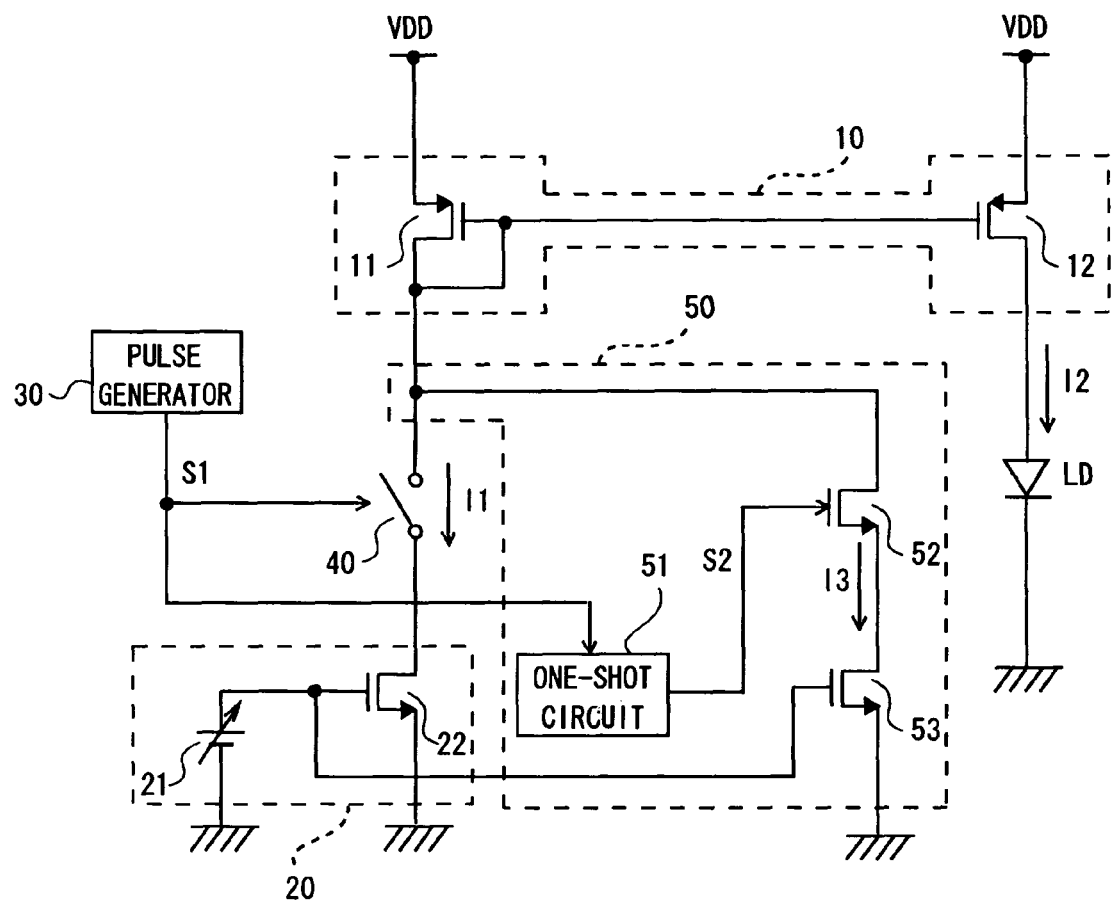
FIG. 6 is a circuit diagram showing a related art.

Exemplary embodiments of the present invention are described hereinafter with reference to the drawings. FIG. 1 shows a current switching circuit according to a first embodiment of the present invention. In FIG. 1, the same elements as in FIG. 6 are denoted by the same reference numerals and not particularly described herein. Like the circuit of FIG. 6, the current switching circuit of this embodiment includes the current mirror 10, the variable current source 20, the pulse generator 30, and the switch 40. Unlike the circuit of FIG. 6, the current switching circuit of this embodiment includes a current energized circuit 60 rather than the current energized circuit 50.

The current energized circuit 60 includes a one-shot circuit 61, an N-channel MOS transistor 62, and an inverting amplifier 63. The one-shot circuit 61 supplies to the inverting amplifier 63 a one-shot pulse control signal S2 which falls in synchronization with the rising of a control signal S1 from the pulse generator 30. The inverting amplifier 63 is composed of P-channel MOS transistors 64 and 65 and N-channel MOS transistors 66 and 67. The MOS transistors 64 and 65 form a current mirror 68. The drain terminal of the MOS transistor 65 which serves as the output terminal of the current mirror 68 is connected to the gate terminal of the MOS transistor 62. The MOS transistor 66 is controlled by the variable voltage source 21 to regulate the current I5 flowing into the MOS transistor 64 in proportion to the current I1. The MOS transistor 67 turns ON when the control signal S2 is H level so that the MOS transistor 62 turns OFF. At this time, the current i4 which is proportional to the current I5 between the power supply voltage VDD and the ground voltage GND flows into the MOS transistor 65. The MOS transistor 67 turns OFF when the control signal S2 is L level so that the power supply voltage is supplied to the gate terminal of the MOS transistor 62 through the MOS transistor 65. At this time, the current i4 in accordance with the intensity of the output current I2 flows transiently through the MOS transistor 65 between the power supply voltage VDD and the gate terminal of the MOS transistor 62. Thus, the inverting amplifier 63 forms a variable resistor between the power supply voltage VDD and the gate terminal of the MOS transistor 62. The MOS transistor 62 is controlled by the inverting amplifier 63 at the rising edge of the output current I2 such that the slope of the rising waveform of the ON potential supplied to its gate voltage is in accordance with the intensity of the output current I2 to regulate the additional current I3 to be supplied to the MOS transistor 11. Therefore, the inverting amplifier 63 forms a controller for controlling the slope of the rising waveform of the ON potential supplied to the gate terminal of the MOS transistor 62 at the rising edge of the output current I2 in accordance with the intensity of the output current I2.

Figure 2:
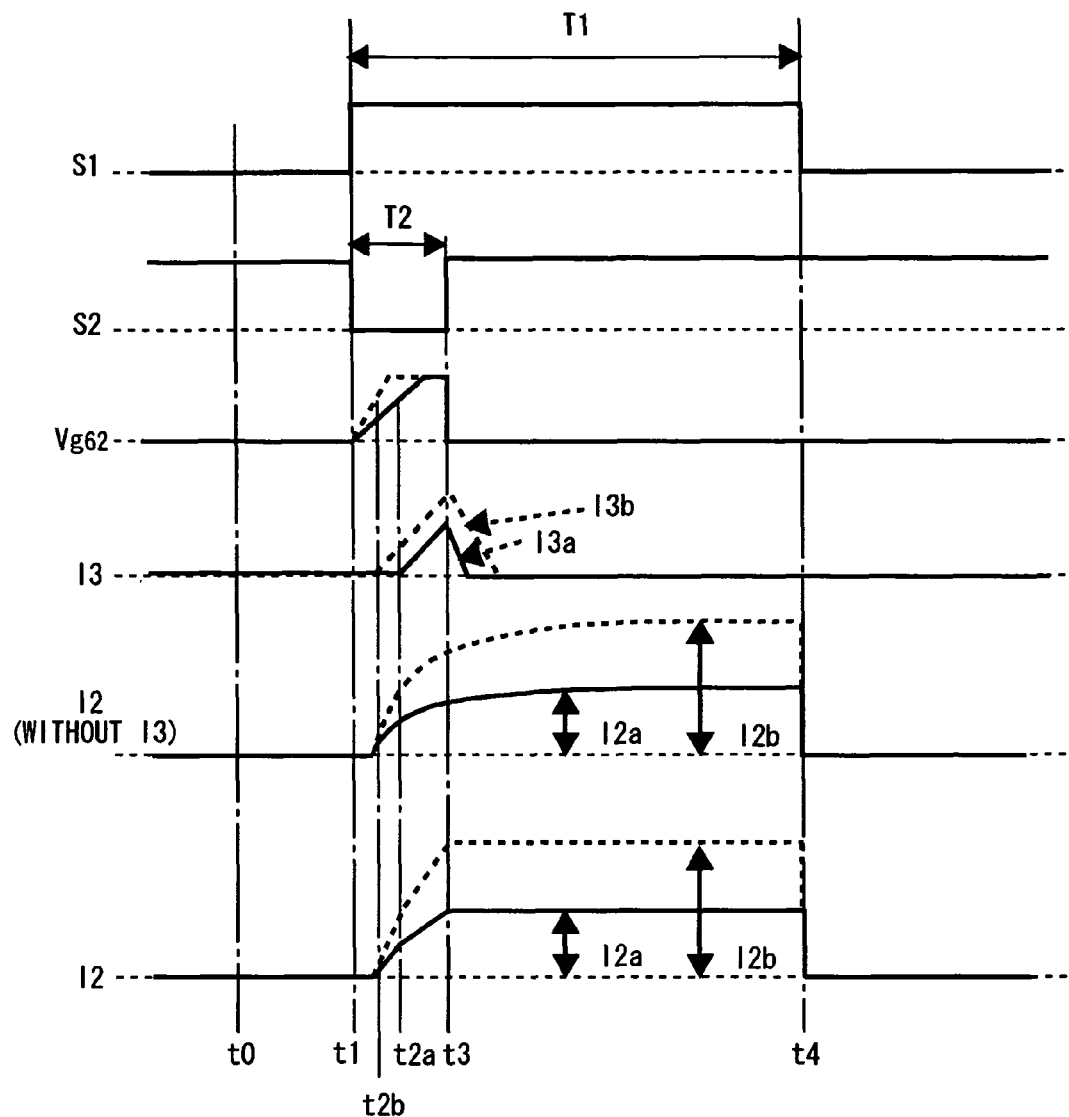
FIG. 2 is a view showing the waveforms of the elements in FIG. 1.

The operation of this circuit is described hereinafter. As shown in FIG. 2, at time 0, the control signal S2 is H level, the MOS transistor 67 is ON, and the MOS transistor 62 is OFF; accordingly, the additional current I3 does not flow. In FIG. 2, the full line indicates the case where the output current I2 is relatively small current I2a, and the dotted line indicates the case where the output current I2 is relatively large current I2b. The pulse generator 30 outputs the control signal S1 with the pulse width T1 which rises at time t1 and falls at time t4, and the one-shot circuit 61 outputs the control signal S2 with the pulse width T2 which falls at time t1 and rises at time t3.

(1) When the Output Current I2 is Relatively Small Current I2a

The variable voltage source 21 is adjusted such that the current I1 corresponding to the output current I2=I2a (which is smaller than that when the output current I2=I2b) flows. Accordingly, the current i4 proportional to the current I1 (which is smaller than that when the output current I2=I2b) flows into the MOS transistor 65. Thus, the ON resistance of the MOS transistor 65 is larger than that when the output current I2=I2b. At time t1 when the control signal S2 becomes L level, the MOS transistor 67 turns OFF, and the power supply voltage VDD is supplied to the gate of the MOS transistor 62 through the MOS transistor 65 with high ON resistance. A gate voltage Vg 62 of the MOS transistor 62 thereby rises at a speed in accordance with the ON resistance of the MOS transistor 65 (the slope of the rising waveform is more gentle than that when the output current I2=I2b. At time t2a when the gate voltage Vg 62 of the MOS transistor 62 rises to exceed a threshold voltage of the MOS transistor 62, the MOS transistor 62 turns ON (a time to turn ON is longer than that when the output current I2=I2b) and the additional current I3a starts flowing. Until time t3 when the control signal S2 turns H level, the MOS transistor 62 stays ON (the ON period is shorter than that when the output current I2=I2b) so that the additional current I3=I3a (which is smaller than that when the output current I2=I2b) flows, and the additional current I3a flows additionally into the MOS transistor 11 so as to complement the rounding of the rising edge of the current I1 and to prevent the overshoot. Accordingly, the output current I2=I2a with a shorter rising time than that without the additional current I3a flows.

(2) When the Output Current I2 is Relatively Large Current I2b

The variable voltage source 21 is adjusted such that the current I1 corresponding to the output current I2=I2b (which is larger than that when the output current I2=I2a) flows. Accordingly, the current i4 proportional to the current I1 (which is larger than that when the output current I2=I2a) flows to the MOS transistor 65. Thus, the ON resistance of the MOS transistor 65 is smaller than that when the output current I2=I2a. At time t1, the power supply voltage VDD is supplied to the gate of the MOS transistor 62 through the MOS transistor 65 with low ON resistance as in the case where the output current I2=I2a. A gate voltage Vg 62 of the MOS transistor 62 thereby rises at a speed in accordance with the ON resistance of the MOS transistor 65 (the slope of the rising waveform is steeper than that when the output current I2=I2a). At time t2b, the MOS transistor 62 turns ON (a time to turn ON is shorter than that when the output current I2=I2a) and the additional current I3b starts flowing as in the case where the output current I2=I2a. Until time t3 when the control signal S2 turns H level, the MOS transistor 62 stays ON (the ON period is longer than that when the output current I2=I2a) so that the additional current I3=I3b (which is larger than that when the output current I2=I2a) flows, and the additional current I3b flows additionally into the MOS transistor 11 so as to complement the rounding of the rising edge of the current I1 and to prevent the overshoot. Accordingly, the output current I2=I2b with a shorter rising time than that without the additional current I3b flows.

As described in the foregoing, in the current switching circuit which outputs the additional current I3 in accordance with the intensity of the output current I2 from the MOS Transistor 62 of the current energized circuit 60 at the rising edge of the output current I2, a MOS transistor equivalent to the MOS transistor 53 in FIG. 6 is eliminated between the source of the MOS transistor 62 and the ground voltage GND. Instead, the inverting amplifier 63 is used to control the slope of the rising waveform of the ON potential which is supplied to the gate terminal of the MOS Transistor 62 at the rising edge of the output current I2 in accordance with the intensity of the output current I2. This configuration reduces the possibility that the overshoot or the rounding occurs at the rising edge of the output current I2 upon changing the intensity of the output current I2.

Figure 3:
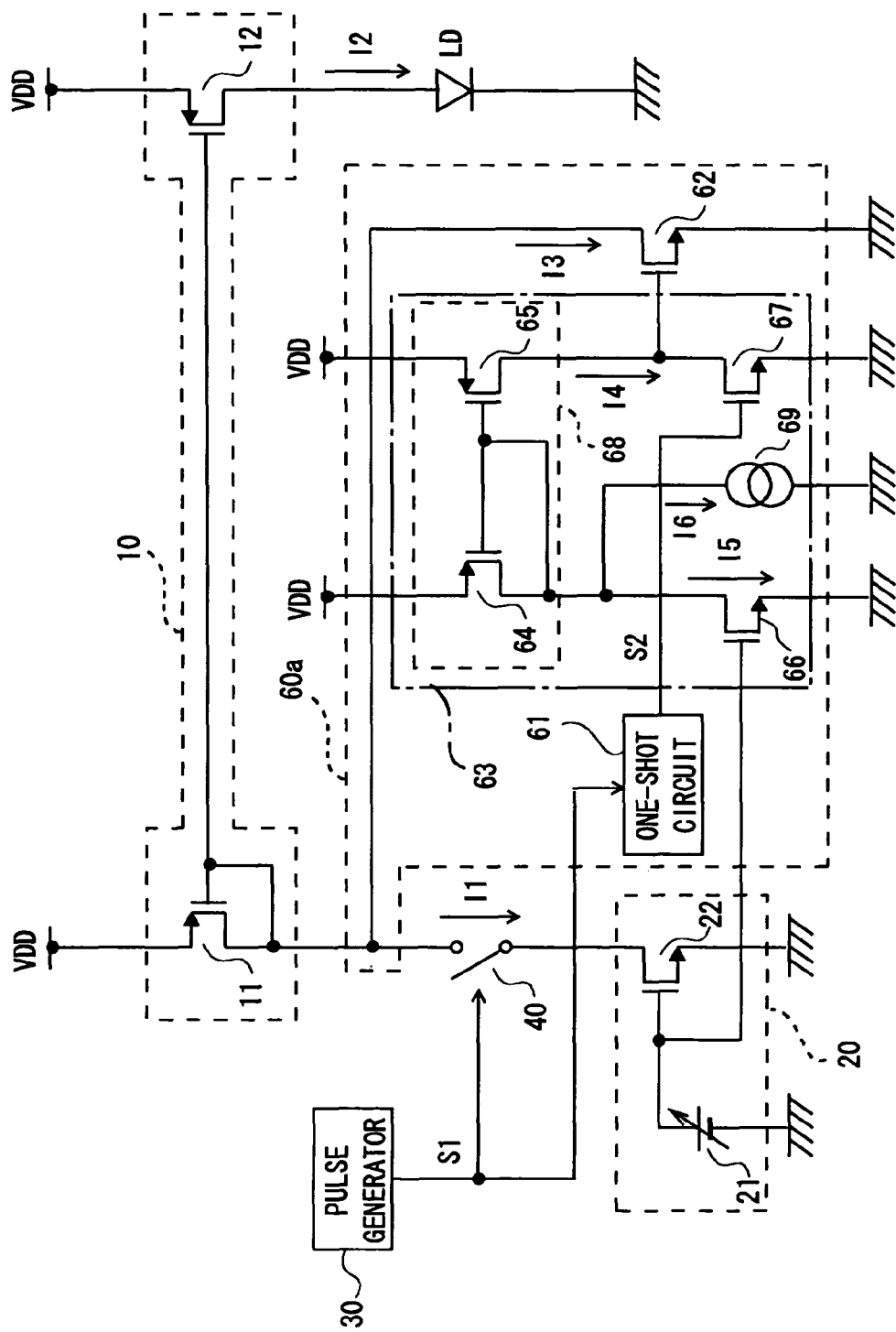
FIG. 3 is a circuit diagram showing another example of the first embodiment of the present invention.

FIG. 3 shows another example of the first embodiment of the present invention. In FIG. 3, the same elements as in FIG. 1 are denoted by the same reference numerals and not described in detail herein. The circuit of FIG. 3 includes a current energized circuit 60a rather than the current energized circuit 60 shown in FIG. 1. The current energized circuit 60a has a constant current source 69 which is connected in parallel with the MOS transistor 66 in addition to the components of the current energized circuit 60. In the circuit of FIG. 1, if the output current I2 becomes smaller than the output current I2a shown in FIG. 2 and the current I1 becomes minute, the current I4 also becomes minute to cause the significant delay in the rise of the gate voltage Vg 62 of the MOS transistor 62, so that the additional current I3 fails to flow. To avoid this, in the circuit of FIG. 3, the constant current source 69 allows idling current I6 to flow through the MOS transistor 64 in order that the additional current I3 flows to enable the current i4 at which the output current I2 rises normally to flow into the MOS transistor 65 even if the current I1 becomes minute.

Figure 4:
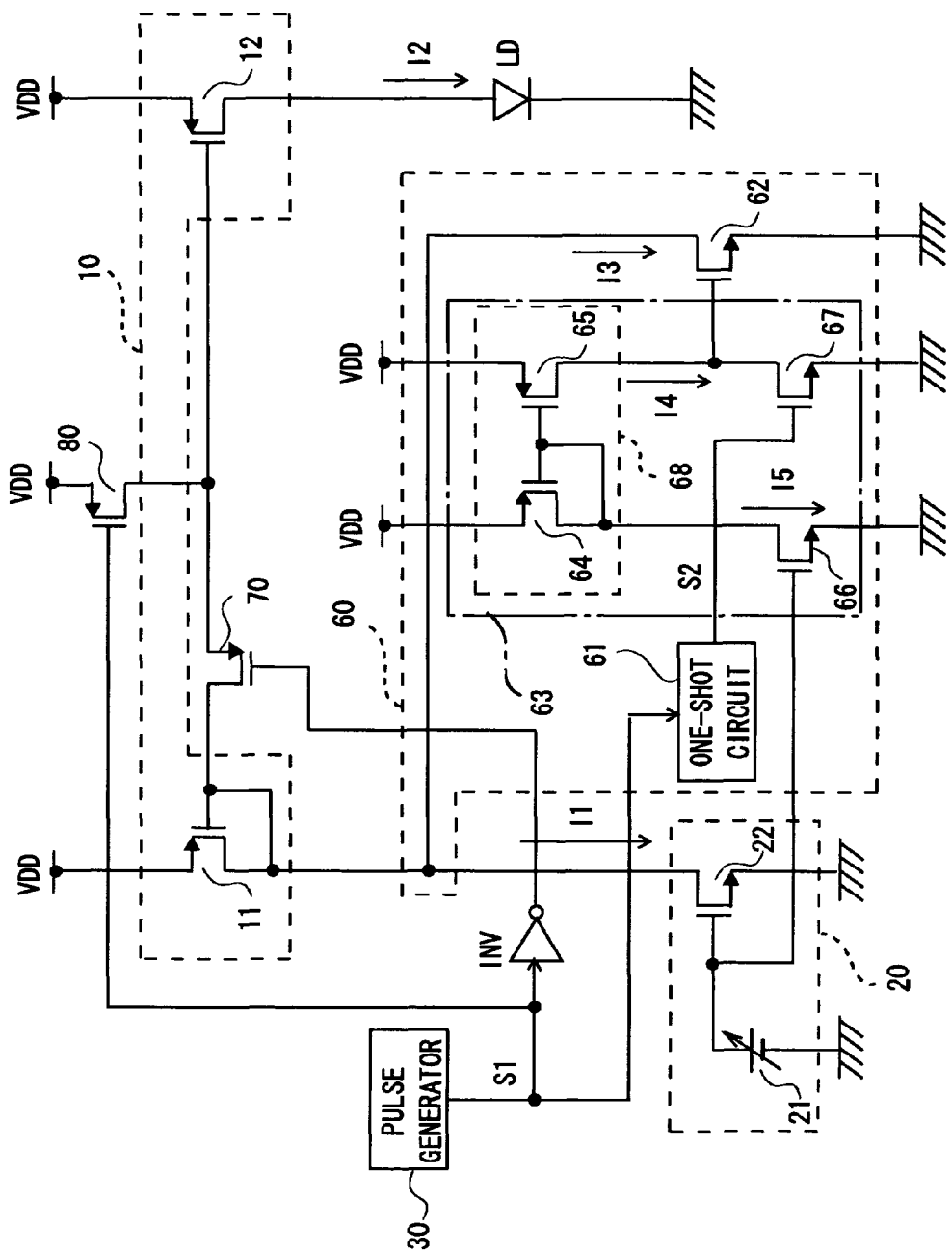
FIG. 4 is a circuit diagram showing a second embodiment of the present invention.

FIG. 4 shows a second embodiment of the present invention. In FIG. 4, the same elements as in FIG. 1 are denoted by the same reference numerals and not described in detail herein. The circuit of this embodiment includes a P-channel MOS transistor 70 which serves as a switch between the gates of the MOS transistors 11 and 12 rather than the switch 40 shown in FIG. 1. The pulse generator 30 is connected to the gate of the MOS transistor 70 through an inverter INV. The circuit further includes a P-channel MOS transistor 80 which pulls the gate voltage of the MOS transistor 12 to the OFF control voltage (power supply voltage VDD) in order to prevent the gate voltage of the MOS transistor 12 from being indeterminate when the MOS transistor 70 turns OFF. The pulse generator 30 is connected to the gate of the MOS transistor 80.

In the circuit of FIG. 1, the ON/OFF of the output current I2 is controlled by turning ON/OFF the supply of the current I1 to the MOS transistor 11. On the other hand, in the circuit of FIG. 4, the current I1 is constantly supplied to the MOS transistor 11, and the ON/OFF of the output current I2 is controlled by turning ON/OFF the mirror connection from the MOS transistor 12 to the MOS transistor 11 using the MOS transistor 70. The other operation is the same as in FIG. 1 and not described herein. Because the circuit of FIG. 1 controls the supply of the current I1 to the MOS transistor 11 using the switch 40, the current waveform can be deformed at the rising edge of the current I1, which causes a slight reduction in the stability of the rising waveform of the output current I2 when the additional current I3 is added to the current I1. On the other hand, because the circuit of FIG. 4 provides a constant supply of the current I1 to the MOS transistor 11, the current I1 flows into the MOS transistor 11 is constant. This configuration further reduces the possibility that the overshoot or the rounding occurs at the rising edge of the output current I2 upon changing the intensity of the output current I2.

Figure 5:
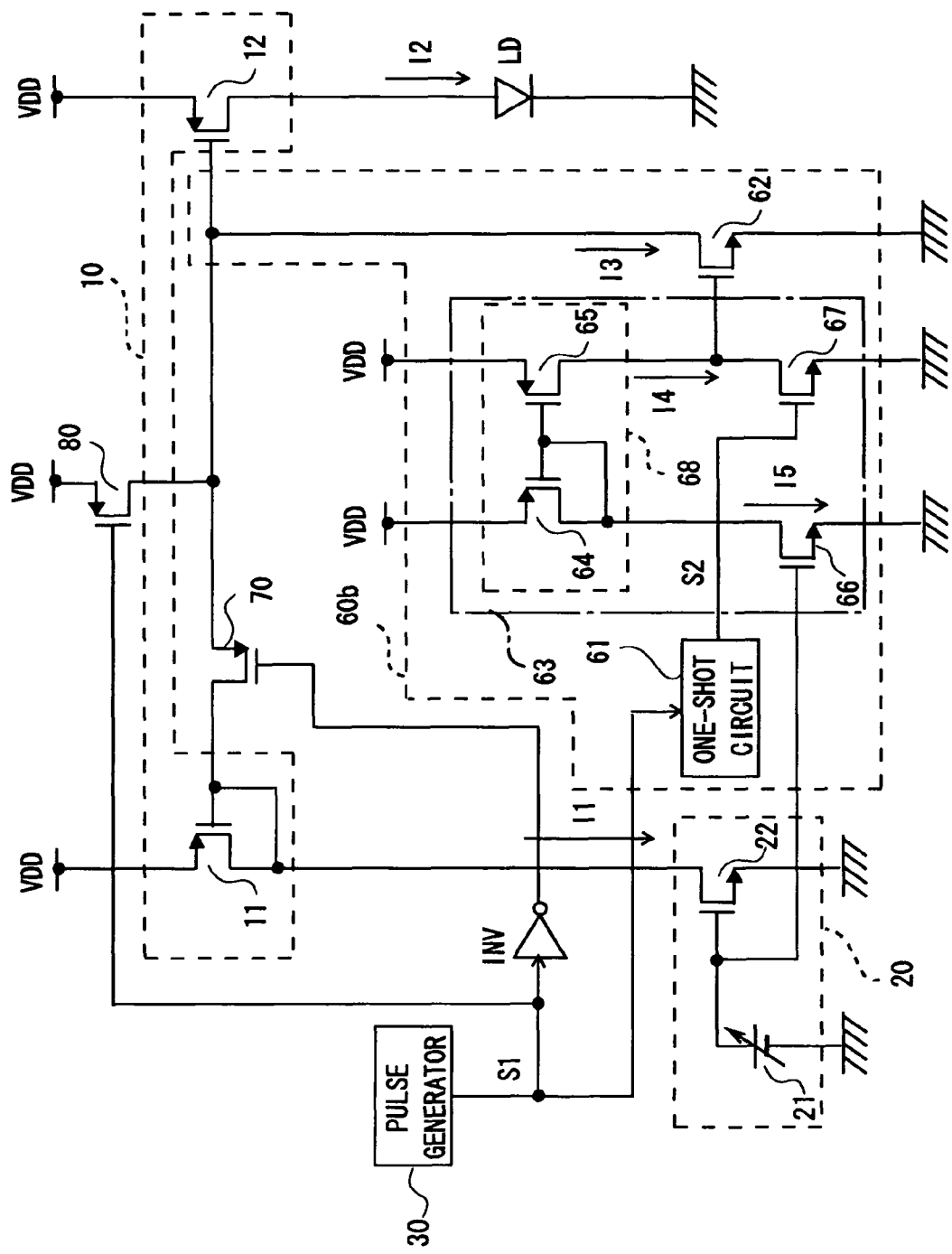
FIG. 5 is a circuit diagram showing another example of the second embodiment of the present invention.

FIG. 5 shows another example of the second embodiment of the present invention. In FIG. 5, the same elements as in FIG. 4 are denoted by the same reference numerals and not described in detail herein. The circuit of FIG. 5 includes a current energized circuit 60b rather than the current energized circuit 60 shown in FIG. 4. Although the drain of the MOS transistor 62 is connected to the drain of the MOS transistor 70 in the current energized circuit 60, the drain of the MOS transistor 62 is connected between the source of the MOS transistor 70 and the gate of the MOS transistor 12 in the current energized circuit 60b. The operation is the same as in the circuit of FIG. 4.

In the first embodiment, the gate voltage of the MOS transistor 12 is not indeterminate when the switch 40 turns OFF without using the MOS transistor 80 as in the second embodiment. The use of the MOS transistor 80, however, enables the reduction of the falling time of the output current I2 at time t4 when the control signal S1 becomes L level as shown in FIG. 2. In the first and second embodiments described above, the P-channel MOS transistor and the N-channel MOS transistor may be replaced by the N-channel MOS transistor and the P-channel MOS transistor, respectively.

It is apparent that the present invention is not limited to the above embodiment and it may be modified and changed without departing from the scope and spirit of the invention.

What is claimed is:

1. A current switching circuit that adds additional current to an input current of a current mirror at a rising edge of an output current of the current mirror, in accordance with an intensity of the output current of the current mirror, the current switching circuit comprising:
    a metal oxide semiconductor (MOS) transistor outputting the additional current upon receiving an ON potential at a gate terminal, a slope of a leading edge waveform of a voltage provided to the gate terminal being controlled in accordance with the intensity of the output current.

2. The current switching circuit according to claim 1, further comprising:
    a variable resistor controlling the slope of the leading edge waveform.

3. The current switching circuit according to claim 2, wherein the variable resistor comprises a second current mirror receiving current in accordance with the intensity of the output current and outputting the ON potential at the rising edge of the output current.

4. The current switching circuit according to claim 3, wherein the second current mirror comprises a constant current source supplying an idling current.

5. A current switching circuit, comprising:
    a first current mirror outputting a second current proportional to an input first current;
    a variable current source generating the first current; and
    a current energized circuit generating a third current to be added to the first current at a rising edge of the second current, in accordance with an intensity of the second current, the current energized circuit including:
        a metal oxide semiconductor (MOS) transistor outputting the third current; and
        a controller controlling a slope of a leading edge waveform of a voltage provided to a gate terminal of the MOS transistor, in accordance with the intensity of the second current at the rising edge of the second current.

6. The current switching circuit according to claim 5, wherein the controller comprises a variable resistor connected between a power supply of an ON potential and the gate terminal of the MOS transistor.

7. The current switching circuit according to claim 6, wherein the variable resistor comprises a second current mirror receiving current in accordance with the intensity of the second current and outputting the ON potential at the rising edge of the second current.

8. The current switching circuit according to claim 7, wherein the second current mirror comprises a constant current source supplying an idling current.

9. The current switching circuit according to claim 5, further comprising:
    a switch controlling the rising edge of the second current by a first control signal, disposed on an input side of the first current mirror.

10. The current switching circuit according to claim 5, further comprising:
    a switch controlling the rising edge of the second current by a first control signal, disposed between an input side and an output side of the first current mirror.

11. The current switching circuit according to claim 9, further comprising:
    a one-shot circuit generating a second control signal to activate a supply of an ON potential to the MOS transistor in synchronization with a leading edge of the first control signal.

12. A current switching circuit, comprising:
a first current mirror;
a switch controlled by a pulse signal;
a variable current source coupled to an input of the first current mirror through the switch;
a one-shot circuit controlled by the pulse signal;
a controller coupled to the variable current source and the one-shot circuit; and
a first MOS transistor connected to the input of the first current mirror, a gate of the first MOS transistor being coupled to the controller.

13. The current switching circuit according to claim 12, wherein the controller comprises:
a second current mirror;
a second MOS transistor, a gate of which is coupled to the variable current source, connected to an input of the second current mirror; and
a third MOS transistor, a gate of which is coupled to the one-shot circuit, connected to an output of the second current mirror,
wherein the output of the second current mirror is coupled to the first MOS transistor.

\* \* \* \* \*